(12) United States Patent
Sackrison et al.

(10) Patent No.: US 7,087,463 B2
(45) Date of Patent: Aug. 8, 2006

(54) LASER SEPARATION OF ENCAPSULATED SUBMOUNT

(75) Inventors: Michael Sackrison, Bethlehem, PA (US); Xiang Gao, Edison, NJ (US); Bryan S. Shelton, Bound Brook, NJ (US); Ivan Eliashevich, Maplewood, NJ (US)

(73) Assignee: GELcore, LLC, Valley View, OH (US)

( * ) Notice: Subject to any disclaimer, the term of this patent is extended or adjusted under 35 U.S.C. 154(b) by 0 days.

(21) Appl. No.: 10/911,052

(22) Filed: Aug. 4, 2004

(65) Prior Publication Data

US 2006/0030125 A1 Feb. 9, 2006

(51) Int. Cl.
*H01L 21/44* (2006.01)
*H01L 21/46* (2006.01)
*H01L 21/00* (2006.01)

(52) U.S. Cl. .................... 438/113; 438/460; 438/68; 438/69

(58) Field of Classification Search ................ 438/460, 438/463, 68–69, 462
See application file for complete search history.

(56) References Cited

U.S. PATENT DOCUMENTS

| 6,413,839 B1 * | 7/2002 | Brown et al. ............... 438/463 |
| 6,468,821 B1 | 10/2002 | Maeda et al. |
| 6,746,889 B1 | 6/2004 | Eliashevich et al. |
| 2002/0028527 A1 | 3/2002 | Maeda et al. |
| 2003/0003690 A1 | 1/2003 | Nering et al. |

FOREIGN PATENT DOCUMENTS

JP 2002270901 A * 9/2002

* cited by examiner

*Primary Examiner*—Ha Tran Nguyen
(74) *Attorney, Agent, or Firm*—Fay, Sharpe, Fagan, Minnich & McKee, LLP

(57) ABSTRACT

In a light emitting package fabrication process, a plurality of light emitting chips (10) are attached on a sub-mount wafer (14). The attached light emitting chips (10) are encapsulated. Fracture-initiating trenches (30, 32) are laser cut into the sub-mount wafer (14) between the attached light emitting chips (10) using a laser. The sub-mount wafer (14) is fractured along the fracture initiating trenches (30, 32).

14 Claims, 6 Drawing Sheets

LASER SEPARATION OF ENCAPSULATED SUBMOUNT

BACKGROUND

The following relates to the lighting arts. It especially relates to high intensity light emitting diode chip packages, components, apparatuses, and so forth, and to methods for producing such packages, and will be described with particular reference thereto. However, the following will also find application in conjunction with other solid state light emitting chip packages such as vertical cavity surface emitting laser packages, and in conjunction with methods for producing such other packages.

The use of sub-mounts in packaging light emitting diode chips, semiconductor laser chips, and other light emitting chips is well known. The light emitting chip or chips are attached to the sub-mount by soldering, thermosonic bonding, thermocompressive bonding, or another thermally conductive attachment. The light emitting chips are electrically connected to bonding pads or other electrical terminals disposed on the sub-mount by wire bonding, flip-chip bonding, or another suitable technique. In some approaches, the light emitting chip is attached to the sub-mount and in thermal contact with the sub-mount, but is electrically connected by wire bonds to a circuit such that the sub-mount is not part of the electrical circuit.

In a manufacturing setting, a plurality of light emitting chips are typically attached in parallel rows, or in another layout, to a large-area sub-mount wafer. The attached light emitting chips are transfer molded or otherwise encapsulated on the sub-mount wafer. Optionally, the encapsulant includes a dispersed phosphor for performing a selected wavelength conversion. For example, a group-III nitride based light emitting diode chip emits light in the blue to ultraviolet range, and a suitable phosphor can be incorporated into the encapsulant to convert the blue or ultraviolet emission into white light. The sub-mount wafer is then diced to separate individual light emitting packages, each including one or more of the attached and encapsulated light emitting chips along with a supporting portion of the sub-mount wafer.

Typically, the dicing of the sub-mount wafer is performed by mechanical sawing or scribing. Such mechanical separation processes are readily automated, and are advantageously relatively independent of material characteristics; hence, the mechanical sawing or scribing can simultaneously cut through the transfer-molded encapsulant and the sub-mount. However, mechanical separation processes are problematic in the case of sub-mounts of harder materials, such as aluminum nitride, sapphire, and the like. For these materials, a diamond-coated saw blade or a diamond-tipped scribe is used. Diamond-coated saw blades are relatively thick and generally produce cut widths or kerfs of 150 microns or wider, which adversely impacts device density on the sub-mount wafer. Diamond tipped scribes may produce narrower cut widths or kerfs; however, the scribe depth is limited. Hence, thicker sub-mounts cannot be diced by scribing unless the sub-mount is substantially thinned.

Both sawing and scribing effectively cut through any encapsulant material disposed in the dicing lanes. However, both techniques can produce roughened, striated, or otherwise damaged sidewalls that reduce light extraction efficiency. Moreover, mechanical sawing or scribing produces shear forces that tend to delaminate the encapsulant, which can adversely impact device yield.

The following contemplates improved apparatuses and methods that overcome the above-mentioned limitations and others.

BRIEF SUMMARY

According to one aspect, a method is provided. A plurality of light emitting chips are attached on a sub-mount wafer. The attached light emitting chips are encapsulated. Fracture-initiating trenches are laser cut into the sub-mount wafer between the attached light emitting chips using a laser. The sub-mount wafer is fractured along the fracture initiating trenches.

According to another aspect, a method is provided. A plurality of light emitting chips are attached on a sub-mount wafer. Fracture-initiating trenches are laser ablated into the sub-mount wafer between the attached light emitting chips using a laser. The sub-mount wafer is fractured along the fracture initiating trenches.

According to yet another aspect, an apparatus is disclosed, including a plurality of light emitting chips and a sub-mount wafer. The sub-mount wafer has a front principal surface on which the light emitting chips are attached, a back principal surface opposite the front principal surface, and one or more fracture-initiating trenches disposed between the attached light emitting chips. The fracture-initiating trenches have widths less than about 75 microns.

Numerous advantages and benefits of the present invention will become apparent to those of ordinary skill in the art upon reading and understanding the present specification.

BRIEF DESCRIPTION OF THE DRAWINGS

The invention may take form in various components and arrangements of components, and in various process operations and arrangements of process operations. The drawings are only for purposes of illustrating preferred embodiments and are not to be construed as limiting the invention. Except where indicated, layer thicknesses and other dimensions are not drawn to scale.

FIG. 1A shows the sub-mount wafer with the chips attached; FIG. 1B shows the sub-mount wafer after transfer-molded encapsulation; FIG. 1C shows the sub-mount wafer after laser cutting of fracture-initiating trenches; and FIG. 1D shows one of the light emitting packages after sub-mount fracturing.

DETAILED DESCRIPTION OF PREFERRED EMBODIMENTS

Figure 1C:
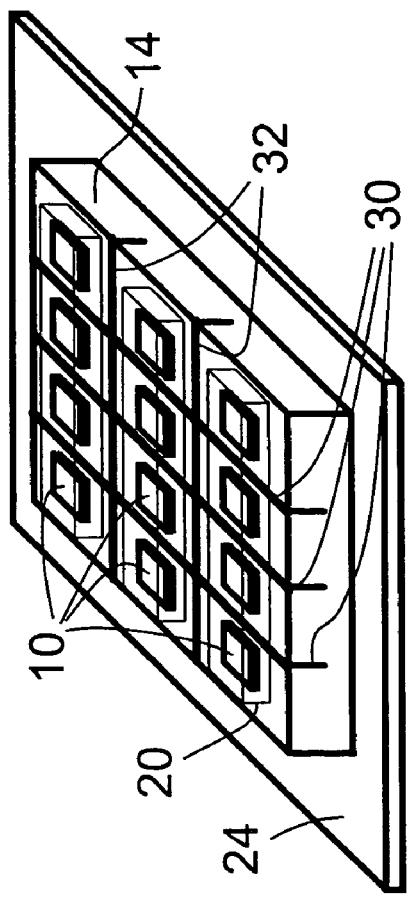
FIGS. 1A–1D show a sub-mount wafer with attached light emitting chips at various stages of a light emitting package fabrication process.

With reference to FIGS. 1A–1D and FIG. 2, a plurality of light emitting chips 10 are bonded to a frontside 12 of a sub-mount wafer 14 in a process operation 100. In typical embodiments, the chips 10 are attached arranged in rows; however, substantially any layout of chip attachments can be used. The light emitting chips 10 can be light emitting diodes, semiconductor lasers, or the like. In some embodiments, the chips are attached by flip-chip bonding the chips 10 to electrical bonding pads disposed on the frontside 12 of the sub-mount wafer 14, which also makes electrical connection of the chips 10 with the sub-mount wafer 14. In other embodiments, the chips 10 are soldered or otherwise thermally attached to the frontside 12 of the sub-mount wafer 14, and wire bonds are used to make electrical connection of the chips 10 with electrically conductive traces disposed on or in the sub-mount wafer 14. In yet other embodiments, the chips 10 are soldered or otherwise thermally attached to the frontside 12 of the sub-mount wafer 14, and wire bonds are used to make electrical connection of the chips 10 with an external circuit, such that the sub-mount is not part of the electrical path. Optionally, the sub-mount wafer 14 can have an array of electrostatic discharge (ESD) protection devices or other electrical circuitry disposed on or in the sub-mount wafer 14, and each chip 10 is electrically connected with such circuitry during the chip attach process 100.

Because the sub-mount wafer 14 will subsequently be separated by laser cutting (described infra), the chips 10 can be attached with a relatively high density. The heat-affected zone of laser ablation for typical cutting lasers and typical sub-mount materials can be focused to about 25 microns; hence, corresponding gaps between adjacent attached chips 10 can be as small as about 25 microns. In contrast, separation by sawing using a diamond-coated blade usually dictates larger gaps between adjacent chips, for example gaps of about 150–250 microns, in order to accommodate the larger widths or kerfs of the diamond-coated blade. Thus, although for illustrative purposes only twelve relatively widely spaced chips 10 are illustrated in FIGS. 1A–1D, it is to be understood that the device packing densities can be substantially higher.

Figure 1D:
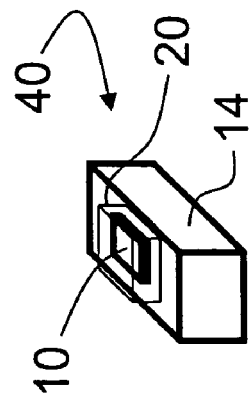
Figure 1A:
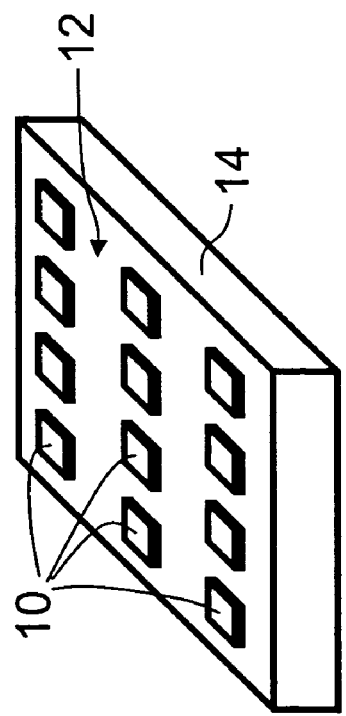
Figure 1B:
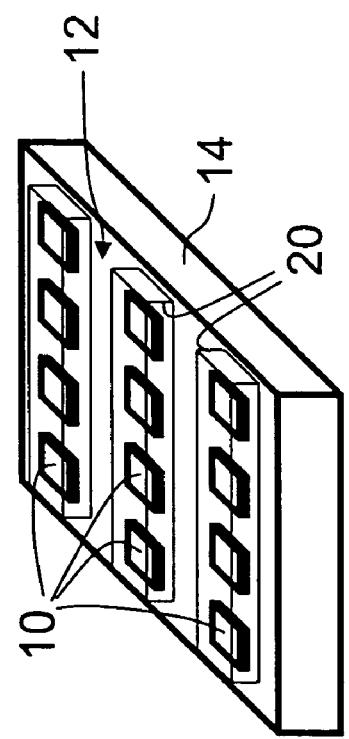
Figure 2:
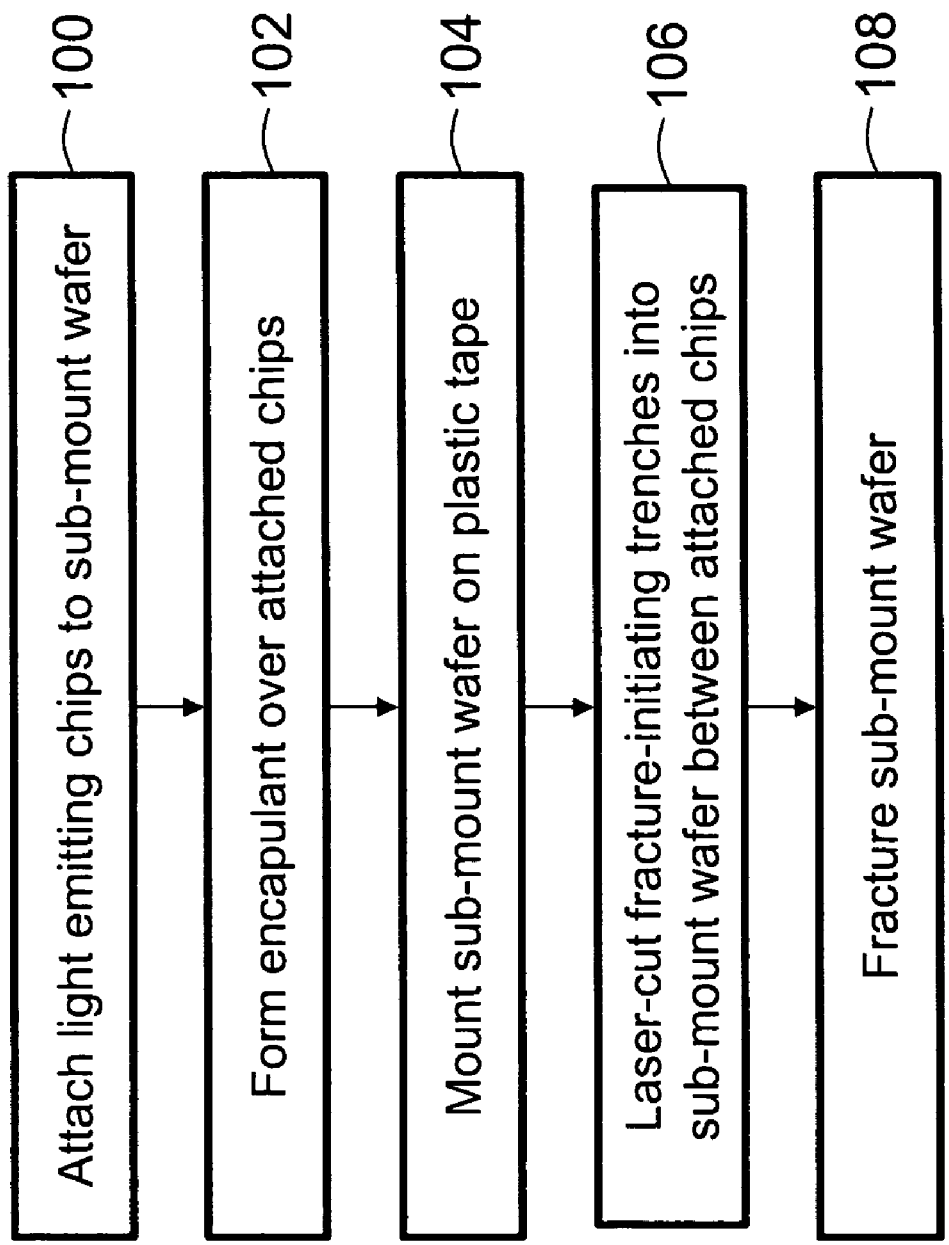
FIG. 2 shows a flow chart of an example light emitting package fabrication process.

With reference to FIG. 1B and FIG. 2, an encapsulant 20 is disposed over the attached chips 10 in a process operation 102. In some embodiments, the encapsulant 20 hermetically seals the light emitting chips 10 to the frontside 12 of the sub-mount wafer 14. In some embodiments, the encapsulant 20 includes a wavelength-converting phosphor that is selected to convert light generated by the light emitting chips 10 to another wavelength. For example, in some embodiments the light emitting chips 10 are group III-nitride based light emitting diode chips emitting in the ultraviolet, and the encapsulant 20 includes a white phosphor that converts the ultraviolet emission to visible white light. In other example embodiments, the light emitting chips 10 are group III-nitride based light emitting diode chips emitting blue light, and the encapsulant 20 includes a yellow phosphor that converts a portion of the blue light to yellow light such that the combination of direct blue emission and wavelength-converted yellow fluorescence or phosphorescence approximates visible white light. In yet other example embodiments, the light emitting chips 10 are group III-arsenide or group III-phosphide based light emitting diode chips that emit red, orange, green, or blue light, and the encapsulant 20 contains no phosphor. These are illustrative examples; more generally, the light emitting chips 10 can be substantially any type of light emitting diode, laser, organic semiconductor chip, or so forth, and the encapsulant 20 may or may not contain phosphor or a blend of phosphors.

In one suitable approach, the encapsulant 20 is applied by transfer molding in which each row of light emitting chips 10 are encapsulated. In the illustrated example of FIGS. 1A–1D, there are three such rows each containing four chips 10, and so there are three transfer molded strips of encapsulant 20. The encapsulant 20 extends over and covers the area of the sub-mount wafer 14 between the chips 10 in each row. In other embodiments, the light emitting chips are each individually encapsulated. In yet other embodiments, a blanket encapsulant is applied across the entire frontside 12 of the sub-mount wafer 14 to encapsulate all the chips 10 in a single encapsulation process, and the encapsulant extends over and covers substantially the entire frontside of the sub-mount wafer. For certain applications, it is also contemplated to omit the encapsulant 20, and the corresponding encapsulation process operation 102, entirely.

The encapsulated chips 10 should generally be electrically accessible unless, for example, the chips 10 are optically pumped, capacitively energized, or so forth, in which cases conductive electrical access to the chips 10 may be omitted. In some embodiments, the sub-mount wafer 14 includes electrically conductive vias passing from the frontside 12 to a backside of the sub-mount wafer 14. Such vias provide electrical connection between backside bonding pads of the sub-mount wafer 14 and electrodes of the attached chips 10. In other embodiments, printed circuitry disposed on the frontside 12 or elsewhere on or in the sub-mount wafer 14 connects with chip electrodes and extends outside of the area covered by the encapsulant 20 to provide electrical access to the light emitting chips 10.

With reference to FIG. 1C and FIG. 2, the sub-mount wafer 14 is secured to adhesive tape 24 in a process operation 104. Fracture-initiating trenches 30, 32 are laser cut into the sub-mount wafer 14 between the light emitting chips 10 in a process operation 106. The fracture-initiating trenches 30, 32 do not pass fully through the sub-mount 14 so as to sever the sub-mount 14 into pieces; rather, each fracture-initiating trench 30, 32 passes partway through the thickness of the sub-mount 14. In some embodiments, the fracture-initiating trenches 30, 32 pass about half-way through the thickness of the sub-mount 14. In the illustrated example, the fracture-initiating trenches 30 run transverse to the encapsulated rows of chips 10 and cut completely through the strips of encapsulant 20, whereas the fracture-initiating trenches 32 run parallel with the strips of encapsulant 20 and hence do not pass through the encapsulant 20.

With reference to FIG. 1D and FIG. 2, the sub-mount wafer 14 is fractured in a process operation 108 at the fracture-initiating trenches 30, 32 to produce individual packages, such as the individual light emitting package 40 shown in FIG. 1D which includes one of the light emitting chips 10 and portions of the encapsulant 20 and sub-mount 14. In the illustrated embodiment, each light emitting package 40 includes a single light emitting chip 10; hence, if the yield is 100% then the sub-mount wafer 14 is diced to produce twelve light emitting packages 40. Although each light emitting package 40 in the illustrated example includes one light emitting chip 10, in other embodiments each package may include two, three, or more light emitting chips. For example, each light emitting package may include a red light emitting diode chip, a green light emitting diode chip, and a blue light emitting diode chip such that the light emitting package is a full-color light emitter.

The laser cutting process operation 106 entails certain difficulties as compared with laser cutting of silicon device wafers and other typical laser cutting applications. The sub-mount generally contains at least two very dissimilar materials: (i) the sub-mount material, and (ii) the encapsulant material. Typical epoxies, resins, and the like used for the encapsulant 20 are relatively soft materials, while sub-mounts for light emitting diode chips are sometimes made of hard materials such as gallium nitride (GaN), aluminum nitride (AlN), silicon carbide (SiC), sapphire ($Al_2O_3$), ceramic materials, and oxide materials. These hard materials typically provide relatively higher thermal conductivity versus softer materials. The large difference in characteristics between the relatively soft encapsulant 20 and the relatively harder sub-mount 14 typically leads to a large difference in cut depth for a single pass of the cutting laser. This difference in cut depth can be two orders of magnitude or larger.

Additionally, characteristics of the sidewalls produced by the laser cutting can be important. The sidewall geometry can impact the light extraction efficiency of the light emitting package 40. For example, sideways-directed light may pass through the sidewall of the encapsulant 20, or may be internally reflected at the sidewall, depending upon the laser-cut geometry of the sidewall. Moreover, it may be advantageous to generate sloped sidewalls that can act as reflectors (either through internal reflection at the encapsulant sidewall/air interface or by applying a reflective coating to the encapsulant sidewall). The geometry of the sloped sidewalls impacts the efficiency of such light reflection.

Figure 3:
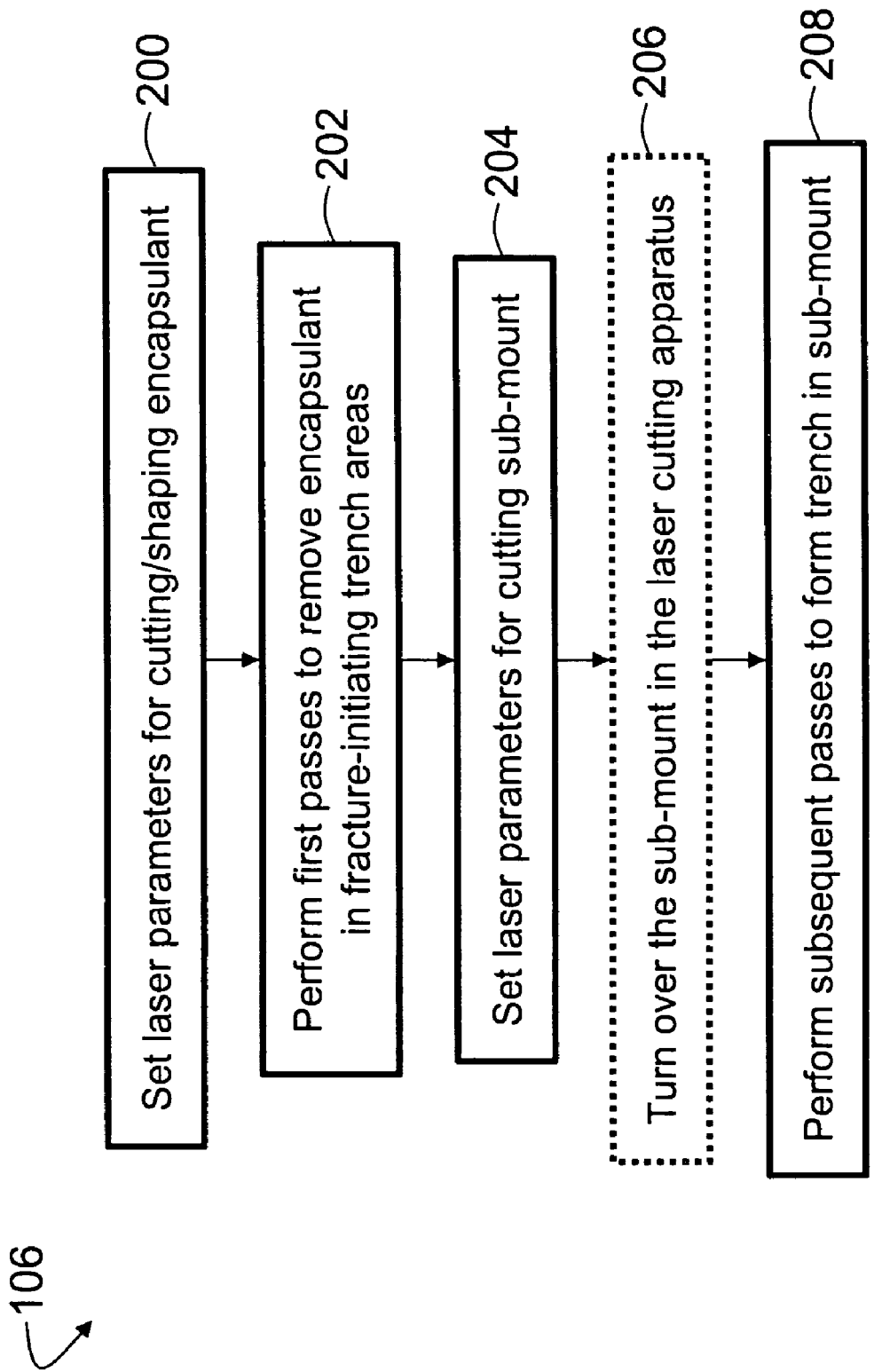
FIG. 3 shows a flow chart of an example laser cutting process.

With reference to FIG. 3, some preferred embodiments of the laser cutting process operation 106 are described. The laser cutting processes 106 use a suitable cutting laser, such as a krypton-fluoride (KrF) excimer laser operating at 248 nm, a diode-pumped solid state laser, a copper ion (Cu-ion) laser, or the like, which is configured to perform multiple passes to form each fracture-initiating trench. In a process operation 200, laser operating parameters are selected for producing laser ablation, melting, or other removal of encapsulant material. These parameters may include, for example: laser power or fluence, laser pulse frequency, beam scan speed along the trench, laser wavelength (in the case of a wavelength-selectable cutting laser), laser beam angle respective to the sub-mount 14, the focused laser beam spot size on the sub-mount 14, and so forth. Typically, a relatively low power is used for cutting the encapsulant 20 in view of the relative softness of the encapsulant material.

In a first cutting process operation 202, one or more passes of the laser are applied to the sub-mount wafer 14 to remove the encapsulant 20 in the area of the trench, and optionally to shape the sidewalls of the encapsulant 20 adjacent the trench. These passes are principally intended to remove the encapsulant 20; however, the cutting process 202 typically also removes some material from the sub-mount 14 as well. However, because the cutting efficiency for the encapsulant material is generally much higher than the cutting efficiency for the sub-mount material, these first passes 202 typically remove mostly encapsulant material.

Optionally, the process operation 200 selected laser parameters which impart a selected sidewall geometry to the sidewalls of the encapsulant 20 formed adjacent the fracture-initiating trench 30 by the laser cutting process operation 202. That is, the encapsulant sidewall geometry is optionally formed simultaneously with the laser cutting of the encapsulant 20. For example, by arranging the laser beam at a selected angle with respect to the frontside surface 12 of the sub-mount 14 (or, equivalently, by tilting the sample relative to the laser beam) during the cutting process operation 202, a selected slope can be imparted to the encapsulant material sidewalls along the fracture-initiating trenches 30. To produce a selected slanted sidewall on both sides of each trench 30, the beam can be used with a selected tilt relative to the sub-mount 14 during a first set of laser passes to form one sidewall, followed by a 180° rotation of the sub-mount 14 (thus effectively reversing the tilt relative to the sub-mount 14), followed by a second set of laser passes to form the other sidewall. Depending upon the tilt of the laser beam relative to the sub-mount 30 during the encapsulant laser cutting process operation 202, the sidewalls can be slanted away from the trench 30 or toward the trench 30 (the latter being an "undercut" encapsulant with slanted sidewalls). Moreover, by varying the laser tilt during the cutting process operation 202, a varying tilt can be produced, such as a sidewall that starts out vertical adjacent the sub-mount 30 and then slants toward or away from the trench 30.

Figure 4:
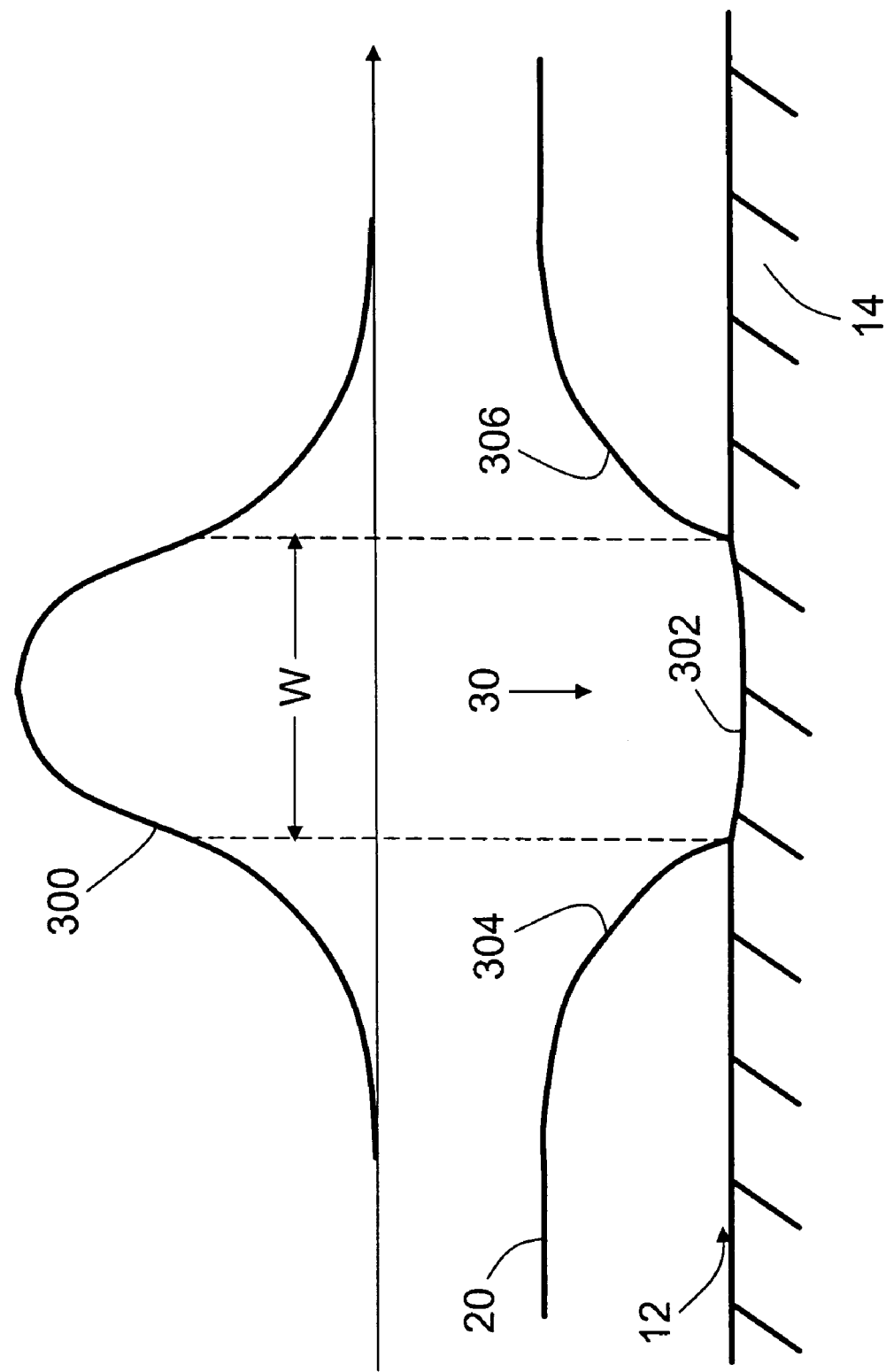
FIG. 4 diagrammatically shows an approach for shaping the encapsulant sidewall geometry during laser cutting. The top of FIG. 4 plots a Gaussian laser beam intensity distribution at the sub-mount; the bottom of FIG. 4 diagrammatically shows the resulting encapsulant sidewall geometry.

With reference to FIG. 4, in yet another approach for producing shaped encapsulant sidewalls, the laser beam can be defocused to produce a broader spot on the sub-mount 14 with a substantial Gaussian intensity variation 300. The Gaussian intensity variation 300 produces a highest intensity in the center of the trench 30, with gradually lower intensities approaching the edges of the trench 30. This intensity variation 300 imparts a spatial variation in cutting rate of the encapsulant 20 that provides sloped encapsulant sidewalls. In a central region of the trench, denoted "W" in FIG. 4, the laser intensity is high enough that the one or more laser passes 202 completely remove the encapsulant 20, and additionally cut slightly into the frontside surface 12 of the sub-mount 14. However, because of the much lower laser ablation rate of the sub-mount material as compared with the ablation rate of the encapsulant material, the removal of sub-mount material in the region "W" is limited, so that only a shallow depression 302 is formed in the frontside surface 12 of the sub-mount 14. Outside the region "W", the laser intensity is too low for the one or more laser passes 202 to completely remove the encapsulant 20. The gradual decrease in laser intensity outside of the region "W" thus produces sloped encapsulant sidewalls 304, 306 adjacent the trench 30.

While the removal of the encapsulant 20 is typically an ablation process, it is to be understood that the laser may remove encapsulant material by another physical process or combination of processes. For example, the laser may melt material of the encapsulant 20 in the vicinity of the trench 30. It is contemplated that under appropriate laser power and other operating conditions, such melted encapsulant material may "ball up" or otherwise shape itself by surface tension or other impetus to produce a slanted or other desirable sidewall characteristic.

With returning reference to FIG. 3, once the encapsulant 20 is removed by one or more first laser passes in the process operation 202, the laser parameters are adjusted in a laser adjustment process operation 204 to optimize the laser for cutting the material of the sub-mount 14. Typically, a higher laser power, fluence, or energy, a slower laser scan speed, higher laser pulse frequency, or other adjustment or combination of adjustments is made to increase the laser ablation rate to more efficiently cut through the harder sub-mount material. If the first laser passes 202 generated selectively shaped encapsulant sidewalls, then the laser adjustment process operation 204 preferably includes more tightly focusing the laser beam on the sub-mount 14 to ensure that the subsequent cutting does not continue to remove encapsulant material from the sloped sidewalls. Tradeoffs can be made between the laser power, beam focusing, beam scanning speed, number of laser passes, and other parameters to control the kerf of the laser cut.

In some embodiments, the same laser parameters are used for cutting both the encapsulant 20 and the sub-mount 14. In these embodiments, the laser adjustment process operation 204 is suitably omitted.

The first laser passes 202 that removed the encapsulant are applied to the frontside 12 of the sub-mount 14. Optionally, the sub-mount 14 is flipped over in the laser cutting apparatus in a process operation 206 before initiating substantial laser cutting into the sub-mount 14, so that the subsequent laser cutting into the sub-mount 14 is performed on the backside. This optional sub-mount flipping operation 206 can reduce contamination or coating of the front-side 12 by laser ablated material. In other embodiments, both the encapsulant 20 and the sub-mount 14 are cut from the frontside 12, in which case the sub-mount flipping operation 206 is omitted.

With the laser operating parameters selected for cutting the sub-mount 14, and with the desired side of the sub-mount 14 exposed to the laser beam, the sub-mount is cut. In a cutting process operation 208, one or more subsequent passes of the laser are applied to the sub-mount wafer 14 to cut the fracture-initiating trench 30 to the desired depth. In experiments performed by the inventors using aluminum nitride sub-mount wafers having about 2.5 cm×5 cm area, a depth of about 47% or greater of the total thickness of the sub-mount was found to produce high device yields in the fracturing process 108. Additional laser cutting beyond that needed to achieve a high device yield in the sub-mount fracturing is generally not advantageous; hence, a trench depth of about one-half of the sub-mount thickness was considered optimal for fracturing these aluminum nitride sub-mount wafers. However, the optimal depth is expected to depend upon many factors, such as sub-mount material and quality, sub-mount thickness, the length of the fracture-initiating trenches, the overall size of the sub-mount wafer, and so forth. For example, it is expected that for thinner sub-mount wafers, such as wafers having thickness under 300 microns, trenches extending a substantially reduced percentage of the way through the sub-mount wafer may be sufficient. Trial cuts for 100 micron thick sub-mount wafers were found to facture well for trenches extending less than 40% of the total sub-mount thickness. Those skilled in the art can readily optimize the depth of the fracture-initiating trenches 30 for specific sub-mounts.

In some embodiments, the sub-mount may include more than one material. For example, the sub-mount may include a silicon wafer and an aluminum nitride wafer which are fused or otherwise bonded together. For such composite sub-mounts, additional laser parameters adjustments may optionally be performed when the laser cutting passes from one sub-mount material into the next sub-mount material. The inventors have found that pre-calibration of the laser cutting time is adequate to reproducibly obtain the desired fracture-initiating trench depth; however, it is also contemplated to employ feedback control of the laser cutting process based on profilometry, phase contrast, or other depth measurements.

The laser cutting process has been described with reference to the fracture-initiating trenches 30, which pass through the encapsulant 20. For forming the fracture-initiating trenches 32 which do not pass through the encapsulant 20, the encapsulant removal process operations 200, 202 are suitably omitted. Moreover, it is to be appreciated that the laser adjustment process operations 200, 204, can include adjustments to both the laser itself and to associated optics, optical filters, beam scanning hardware, and so forth that are associated with the cutting laser and that collectively determine the cutting characteristics of the laser. Such laser adjustments can also be made during the one or more first laser passes 202 and/or during the one or more subsequent laser passes 208. For example, with brief reference back to FIG. 4, during the first laser passes 202 that remove the encapsulant 20 the laser beam spot focus may be continuously adjusted to produce a selected sidewall geometry of the encapsulant sidewalls 304, 306.

An advantage of the disclosed laser cutting method for dicing the sub-mount 14 is that the fracture-initiating trenches 30, 32 can be made narrower in width than can be achieved using mechanical sawing employing a diamond coated saw blade. In some embodiments, the laser cut fracture-initiating trenches 30, 32 have widths or kerfs that are less than about 75 microns. In some embodiments, the laser cut fracture-initiating trenches 30, 32 have widths or kerfs that are less than about 25 microns. In contrast, diamond coated saw blades generally produce kerfs of about 150 microns or wider. The narrower kerfs of the laser cut trenches 30, 32 enables a higher packing density of chips 10 on the sub-mount wafer 14.

The inventors have applied the disclosed packaging techniques, including laser cutting of the sub-mount wafer, to aluminum nitride sub-mounts. A krypton-fluoride (KrF) excimer laser operating at 248 nm was used to separate a 380 micron thick unprocessed aluminum nitride (AlN) sub-mount. The fracture-initiating trenches were cut to a depth of 50% of the total thickness (i.e., about 190 microns), which was found to be sufficient to provide controlled fracture. Another aluminum nitride sub-mount was fully processed, including transfer molding of an encapsulant onto the sub-mount, but did not have light emitting chips attached. This processed sub-mount was similarly laser cut and run through a wafer fracture tool. Complete fracture of the sub-mount and encapsulant into individual devices was achieved. On this sub-mount, the encapsulant was molded to the sub-mount surface without using an adhesion promoter. The omitted adhesion promoter is typically used to reduce the possibility of encapsulant delamination from the sub-mount. Encapsulant delamination was observed in 5% of the devices after fracturing. This result suggests that the laser cutting does not produce substantial shear forces of the type that typically lead to encapsulant delamination, and it is expected that nearly 100% yield should be achieved when the adhesion promoter is included.

Figure 5:
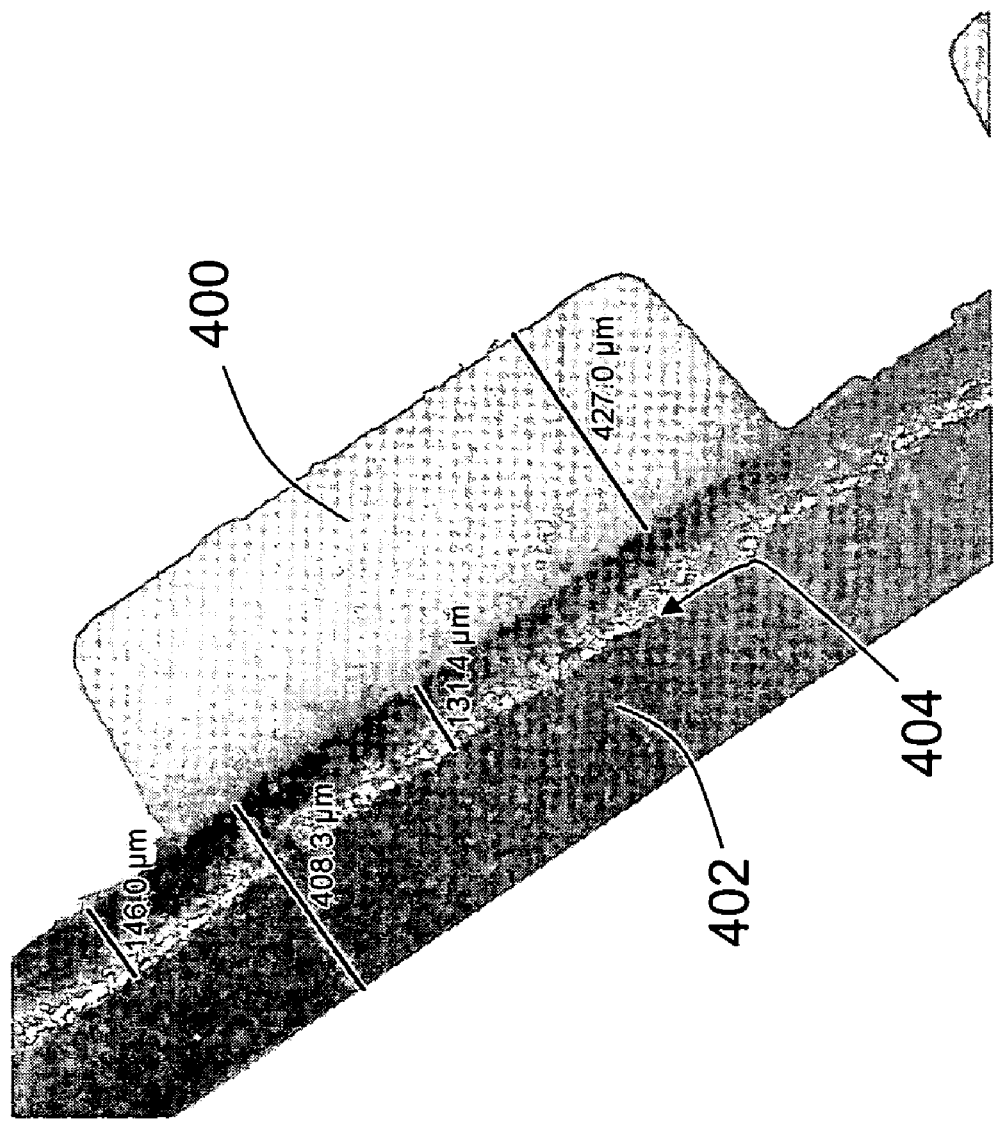
FIG. 5 shows a microscope image of the sidewall of a sub-mount with encapsulant after laser cutting and sub-mount fracturing.
Figure 6:
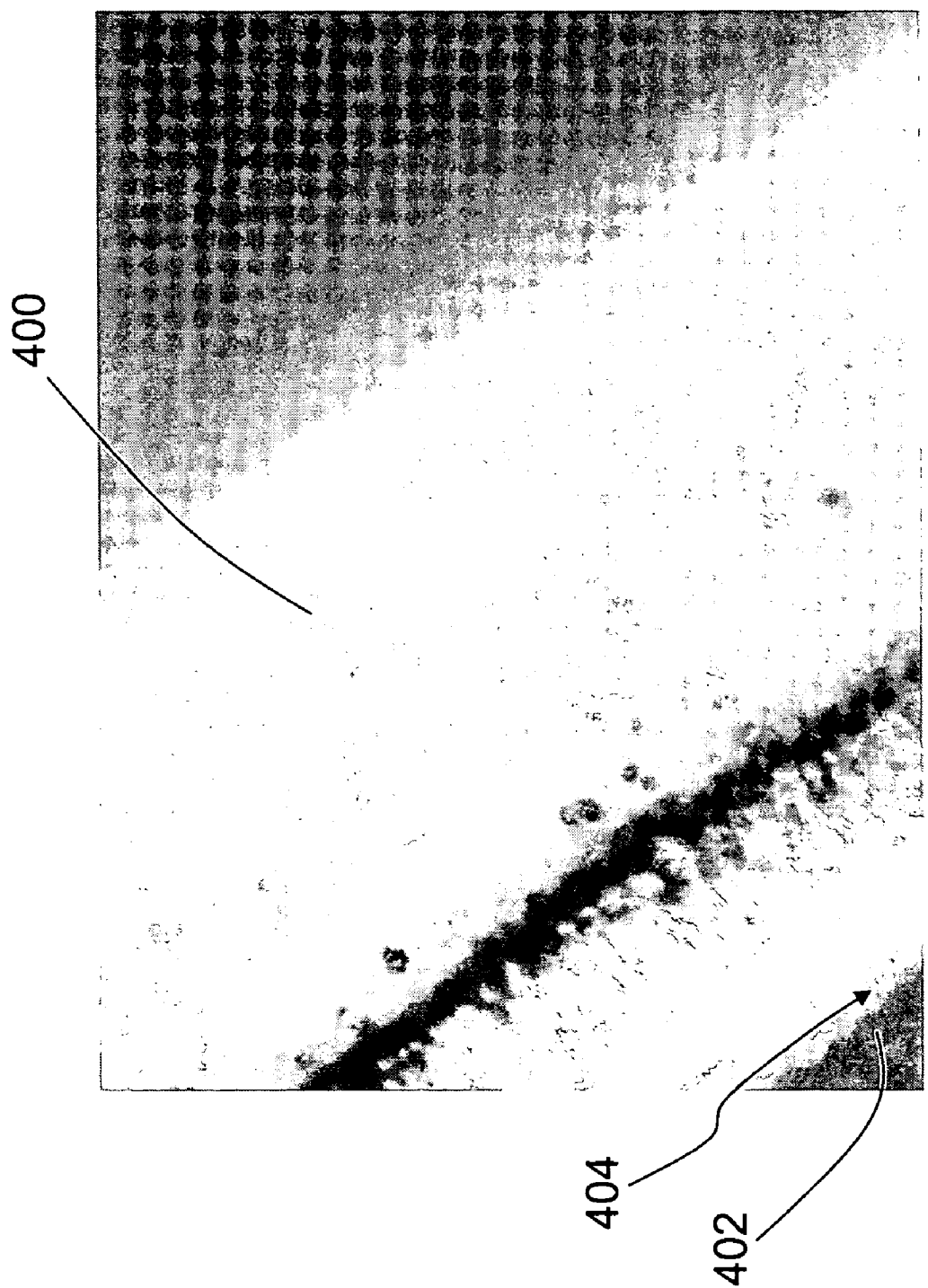
FIG. 6 shows a more magnified microscope image of an encapsulant sidewall after laser cutting and sub-mount fracturing.

With reference to FIGS. 5 and 6, microscopic examination of the sidewalls of the encapsulated and laser-separated aluminum nitride sub-mounts is illustrated. FIG. 5 shows a microscopic image of the encapsulant sidewall 400 and the sub-mount sidewall 402 after laser cutting and sub-mount fracture. Thicknesses are labeled in FIG. 5: the encapsulant has a thickness of about 427.0 microns, while the sub-mount has a thickness of about 408.3 microns. A boundary 404 is visible between the portion of the sub-mount sidewall 402 that was formed by laser cutting, and the remaining portion that was formed by the fracturing. It is observed that the laser cut portion has a depth of about 146.0 microns in areas distal from the encapsulant (corresponding to about 35.7% of the 408.3 micron total sub-mount wafer thickness), and a reduced depth of about 131.4 microns under the encapsulant (corresponding to about 32.2% of the 408.3 micron total sub-mount wafer thickness). The slightly reduced sub-mount laser cutting depth under the encapsulant is due to the fact that the laser cutting had to first remove the encapsulant before reaching the sub-mount wafer itself. However, the difference in cutting depths (146.0 microns versus 131.4 microns) is too small to substantially impact device yield during fracturing. FIG. 6 shows a more magnified view of the encapsulant sidewall 400, which indicates a substantially smooth encapsulant sidewall surface.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

The appended claims follow:

The invention claimed is:

1. The method comprising:
   attaching a plurality of light emitting chips on a sub-mount wafer;
   encapsulating the attached light emitting chips including disposing encapsulant material on the sub-mount in areas between light emitting chips;
   laser-cutting fracture-initiating trenches into the sub-mount wafer between the attached light emitting chips using a laser, the laser-cutting including:
      performing one or more first passes of the laser to remove the encapsulant disposed between the light emitting chips, the performing of one or more first passes including selecting one or more operating parameters of the laser such that the laser produces a selected encapsulant sidewall geometry along the fracture-initiating trenches, and
      performing one or more subsequent passes of the laser to form a trench in the sub-mount wafer; and
   fracturing the sub-mount wafer along the fracture-initiating trenches.

2. The method as set forth in claim 1, wherein the encapsulant is disposed on a frontside of the sub-mount wafer, and the one or more subsequent passes of the laser are performed on a backside of the sub-mount wafer opposite the frontside.

3. The method as set forth in claim 1, wherein the one or more first passes of the laser are performed with first laser operating parameters, and the one or more subsequent passes are performed with second laser operating parameters, the first laser operating parameters differing from the second laser operating parameters.

4. The method as set forth in claim 3, wherein the one or more first passes employ laser operating parameters that provide a relatively lower laser cutting rate, and the one or more subsequent passes employ laser operating parameters that provide a relatively higher laser cutting rate.

5. The method as set forth in claim 1, wherein the laser-cutting of fracture-initiating trenches comprises:
   laser ablating material of the sub-mount wafer to define the fracture-initiating trenches.

6. The method as set forth in claim 1, wherein the fracture-initiating trenches have kerfs of less than about 25 microns.

7. The method as set forth in claim 1, wherein the laser-cutting of fracture-initiating trenches comprises:
   laser-cutting fracture-initiating trenches having widths less than about 75 microns in the sub-mount wafer.

8. The method as set forth in claim 1, wherein the laser cutting of fracture-initiating trenches into the sub-mount wafer includes laser cutting fracture-initiating trenches into a sub-mount wafer made of a material selected from a group consisting of gallium nitride, aluminum nitride, silicon carbide, sapphire, a ceramic material, and an oxide material.

9. A method comprising:
   attaching a plurality of light emitting chips on a sub-mount wafer;
   encapsulating the attached light emitting chips including disposing encapsulant material on the sub-mount in areas between light emitting chips;
   laser-cutting fracture-initiating trenches into the sub-mount wafer between the attached light emitting chips using a laser, the laser-cutting including:
      performing one or more first passes of the laser to remove the encapsulant disposed between the light emitting chips with the laser at one or more selected angles relative to the sub-mount wafer to impart a selected shape to encapsulant sidewalls along the fracture-initiating trenches, and
      performing one or more subsequent passes of the laser to form a trench in the sub-mount wafer; and
   fracturing the sub-mount wafer along the fracture-initiating trenches.

10. The method as set forth in claim 9, wherein the laser-cutting of fracture-initiating trenches comprises:
   performing the one or more subsequent passes of the laser using a laser beam having a width at the sub-mount wafer that is less than or about 25 microns.

11. The method as set forth in claim 9, wherein the laser cutting of fracture-initiating trenches comprises:
   laser ablating material of the sub-mount wafer.

12. The method as set forth in claim 9, wherein the fracture-initiating trenches have kerfs of less than about 75 microns.

13. A method comprising:
   attaching a plurality of light emitting chips on a sub-mount wafer;
   encapsulating the attached light emitting chips including disposing encapsulant material on the sub-mount in areas between light emitting chips;
   laser-cutting fracture-initiating trenches into the sub-mount wafer between the attached light emitting chips using a laser, the laser-cutting including:
      performing one or more first passes of the laser to remove the encapsulant disposed between the light emitting chips with the laser defocused during at least some of the one or more first passes to increase a size of the laser beam, and
      performing one or more subsequent passes of the laser to form a trench in the sub-mount wafer; and
   fracturing the sub-mount wafer along the fracture-initiating trenches.

14. The method as set forth in claim 13, wherein the laser-cutting of fracture-initiating trenches comprises:
   laser-cutting fracture-initiating trenches having widths less than about 25 microns in the sub-mount wafer.

* * * * *